(12) United States Patent
Chen et al.

(10) Patent No.: US 9,697,909 B2
(45) Date of Patent: Jul. 4, 2017

(54) SHIFT REGISTER

(71) Applicant: AU Optronics Corporation, Hsin-Chu (TW)

(72) Inventors: Ya-Ling Chen, Hsin-Chu (TW); Ching-Kai Lo, Hsin-Chu (TW); Chien-Chung Huang, Hsin-Chu (TW); Hua-Gang Chang, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 111 days.

(21) Appl. No.: 14/804,739

(22) Filed: Jul. 21, 2015

(65) Prior Publication Data

US 2016/0141051 A1    May 19, 2016

(30) Foreign Application Priority Data

Nov. 19, 2014  (TW) .............................. 103140055 A

(51) Int. Cl.
  *G11C 19/00* (2006.01)
  *G11C 19/28* (2006.01)
  *G09G 3/36* (2006.01)

(52) U.S. Cl.
  CPC ........... *G11C 19/28* (2013.01); *G09G 3/3677* (2013.01); *G09G 2310/0286* (2013.01)

(58) Field of Classification Search
  None
  See application file for complete search history.

(56) References Cited

U.S. PATENT DOCUMENTS

| 7,764,761 | B2 | 7/2010 | Shih et al. |
| 8,019,039 | B1* | 9/2011 | Tsai .................... G11C 19/184 377/64 |
| 8,098,791 | B2 | 1/2012 | Lin et al. |

(Continued)

FOREIGN PATENT DOCUMENTS

| CN | 101807436 A | 8/2010 |
| CN | 102136241 A | 7/2011 |

(Continued)

OTHER PUBLICATIONS

Office Action issued in corresponding Taiwan application on Jan. 14, 2016.

(Continued)

*Primary Examiner* — Tuan T Lam
(74) *Attorney, Agent, or Firm* — McClure, Qualey & Rodack, LLP

(57) ABSTRACT

A shift register comprises a first switch, a second switch, a third switch, and a fourth switch. The first switch selectively conducts a first clock signal to a first output terminal as a first output signal based on a voltage level over the control terminal. The second switch selectively forces a voltage level of the first output signal to be equal to a voltage level of a second clock signal based on both of the second clock signal and a third clock signal inverted to the second clock signal. The third switch selectively defines a voltage over the control terminal to be a first voltage based on a first input signal. The fourth switch selectively forces the voltage level over the control terminal to be equal to the voltage level of the second clock signal based on both of the second clock signal and the third clock signal.

20 Claims, 11 Drawing Sheets

(56) References Cited

U.S. PATENT DOCUMENTS

| | | | | |
|---|---|---|---|---|
| 8,411,017 | B2* | 4/2013 | Hsu | G09G 3/3677 |
| | | | | 345/100 |
| 8,742,811 | B2 | 6/2014 | Umezaki | |
| 9,318,067 | B2* | 4/2016 | Ma | G09G 3/3674 |
| 2005/0008114 | A1* | 1/2005 | Moon | G09G 3/3677 |
| | | | | 377/64 |
| 2006/0291610 | A1* | 12/2006 | Lo | G11C 19/28 |
| | | | | 377/64 |
| 2008/0080661 | A1* | 4/2008 | Tobita | G11C 19/28 |
| | | | | 377/78 |
| 2008/0219401 | A1* | 9/2008 | Tobita | G09G 3/3677 |
| | | | | 377/79 |
| 2010/0002827 | A1* | 1/2010 | Shih | G09G 3/3677 |
| | | | | 377/57 |
| 2011/0134107 | A1* | 6/2011 | Lebrun | G11C 19/28 |
| | | | | 345/213 |
| 2012/0188210 | A1* | 7/2012 | Zhang | G09G 3/3677 |
| | | | | 345/204 |
| 2015/0332656 | A1 | 11/2015 | He | |

FOREIGN PATENT DOCUMENTS

| | | |
|---|---|---|
| CN | 103943057 A | 7/2014 |
| JP | 2006040477 | 2/2006 |
| TW | I387801 | 1/2010 |
| TW | I384756 | 7/2011 |
| TW | I413965 | 11/2013 |
| TW | 201413731 | 4/2014 |

OTHER PUBLICATIONS

Office Action issued in corresponding China application on Jun. 20, 2016.

* cited by examiner

SHIFT REGISTER

CROSS-REFERENCE TO RELATED APPLICATIONS

This non-provisional application claims priority under 35 U.S.C. §119(a) on Patent Application No(s). 103140055 filed in Taiwan, R.O.C. on Nov. 19, 2014, the entire contents of which are hereby incorporated by reference.

TECHNICAL FIELD

The present disclosure relates to a shift register, and particularly relates to a circuit architecture of the shift register.

BACKGROUND

The shift register is used for controlling the operations of a plurality of adjacent circuit in the field of digital circuit. For example, the shift register is an important unit used in a source driver in display panels. The thin-film transistor (TFT) process is widely used in products with display panels because integrated circuits can be realized on a glass substrate in a display panel with the TFT process.

The source driver and the shift registers therein can also be realized with the TFT process. However, the characteristic parameters of a TFT are different with the preset characteristic parameters because of the process variation or being used for a long time. With in all the variations, the most important one is the variation of the threshold voltage (VTH) of a TFT. Regarding a shift register, the variation of the threshold voltage of a TFT may result in the fact that certain transistor switches in the shift register are not turn off as expected. As a result, the voltage level of the output signal of the shift register would vary and the shift register suffers from extra power dissipation due to the current leakage.

SUMMARY

According to an embodiment, a shift register comprises a first switch, a second switch, a third switch, and a fourth switch. The first switch, based on a voltage level over the control terminal, selectively conducts a first clock signal to a first output terminal as a first output signal. The second switch, based on both of a second clock signal and a third clock signal, selectively forces a voltage level of the first output signal to be equal to a voltage level of the second clock signal, wherein the second clock signal and the third clock signal are inverted to each other. The third switch, based on a first input signal, selectively defines a voltage over the control terminal to be a first voltage. The fourth switch, based on both of the second clock signal and the third clock signal, selectively forces the voltage level over the control terminal to be equal to the voltage level of the second clock signal.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
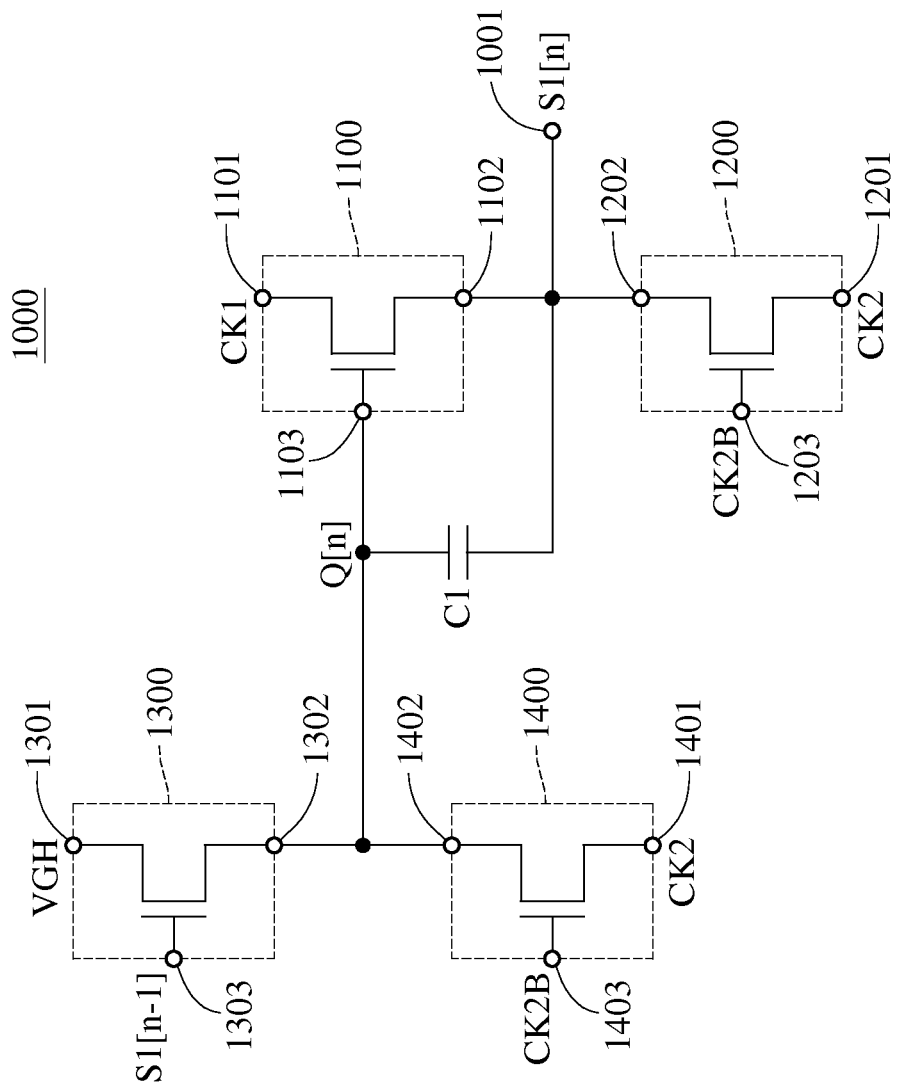
FIG. 1 is a schematic of a shift register according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

About a shift register in one embodiment, please refer to FIG. 1, which is a schematic of a shift register according to one embodiment. As shown in FIG. 1, the shift register 1000 at least comprises a first switch 1100, a second switch 1200, a first capacitor C1, a third switch 1300, and a fourth switch 1400. In the following embodiments, each switch mentioned is realized with an N-type thin-film transistor. However, each switch mentioned can be realized with a P-type thin-film transistor.

In the present embodiment, the first terminal 1101 of the first switch 1100 is configured to receive a first clock signal CK1, and the second terminal 1102 of the first switch 1100 is electrically coupled to a first output terminal 1001 of the shift register 1000, wherein the term "electrically coupled" means directly electrically connected or indirectly electrically connected. The control terminal 1103 of the first switch 1100 is coupled to the control terminal Q[n], and whether a conductive path is formed between the first terminal 1101 and the second terminal 1102 is determined by a voltage level over the control terminal Q[n]. Hence, a voltage level of the first clock signal CK1 is selectively output to the first output terminal 1001 as a voltage level of a first output signal S1[n] based on the voltage level over the control terminal Q[n].

Specifically, when the voltage level over the control terminal Q[n] is low, the first switch 1100 is not conducted, which means that there is no conductive path between the first terminal 1101 and the second terminal 1102. In this condition, the voltage level of the first output signal S[n] is irrelevant to the voltage level of the first clock signal CK1.

When the voltage level over the control terminal Q[n] is high, the first switch 1100 is conducted, which means that a conductive path between the first terminal 1101 and the second terminal 1102 is formed. In this condition, the voltage level of the first output signal S1[n] is pulled to a high voltage or forced to essentially equal to the high voltage if voltage level of the first clock signal CK1 is equal to the high voltage. In the same condition, the voltage level of the first output signal S1[n] is pulled to a low voltage or forced to essentially equal to the low voltage if voltage level of the first clock signal CK1 is equal to the low voltage. Besides, when the first switch 1100 is conducted, the voltage level of the first output signal S1[n] is relevant to the threshold voltage VTH1 of the first switch 1100.

In practice, an upper limit $V_{S1[n],max}$ of the voltage level of the first output signal S1[n] is expressed by the equation (1):

$$V_{S1[n],max} = \min\{V_{CK1}, V_{Q[n]} - VTH1\} \qquad (1)$$

In the equation (1), $V_{CK1}$ is the voltage level of the first clock signal CK1, and $V_{Q[n]}$ is the voltage level over the control terminal Q[n]. That is, the upper limit $V_{S1[n],max}$ of the voltage level of the first output signal S1[n] is determined by the lower voltage level among the voltage level $V_{CK1}$ and the value of subtracting the threshold voltage VTH1 from the voltage level $V_{Q[n]}$ when the voltage level $V_{Q[n]}$ is equal to the high level.

The first terminal 1201 of the second switch 1200 is configured to receive a second clock signal CK2, and the second terminal 1202 of the second switch 1200 is electrically coupled to the first output terminal 1001 of the shift register 1000. The control terminal 1203 of the second switch 1200 is configured to receive a third clock signal CK2B and determining whether a conductive path is formed between the first terminal 1201 and the second terminal 1202 based on a voltage level of the third clock signal CK2B. In the present embodiment, the second clock signal CK2 and the third clock signal CK2B are phase inverted to each other in voltage. Explicitly, the voltage level of the third clock signal CK2B is equal to the low voltage when the voltage level of the second clock signal CK2 is equal to the high voltage, and the voltage level of the third clock signal CK2B is equal to the high voltage when the voltage level of the second clock signal CK2 is equal to the low voltage.

Hence, the second switch 1200 is conducted, which means that a conductive path is form between the first terminal 1201 and the second terminal 1202, when the voltage level of the third clock signal CK2B is equal to the high voltage. In this condition, because the voltage level of the second clock signal CK2 is equal to the low voltage, the voltage level of the first output signal S1[n] output by the first output terminal 1001 is therefore pulled to the low voltage by the second clock signal CK2. When the voltage level of the third clock signal CK2B is equal to the low voltage and the voltage level of the second clock signal CK2 is equal to the high voltage, the second switch 1200 is not conducted, which means that there is no conductive path formed between the first terminal 1201 and the second terminal 1202, if the voltage level of the first output signal S1[n] is equal to the high voltage.

The first capacitor C1 is electrically coupled between the first output terminal 1001 and the control terminal 1103 of the first switch 1100. In other words, the first capacitor C1 is electrically coupled between the first output signal S1[n] and the control terminal Q[n], so a voltage variation of the first output signal S1[n] is coupled to the control terminal Q[n] by the first capacitor, vice versa.

The first terminal 1301 of the third switch 1300 is coupled to a high voltage VGH, and the second terminal 1302 of the third switch 1300 is electrically coupled to the control terminal 1103 of the first switch 1100. The control terminal 1303 of the third switch 1300 is configured to receive the first input signal S1[n−1], which is the output signal of the precedent shift register. Whether a conductive path between the first terminal 1301 and the second terminal 1302 is formed is determined by the voltage level of the first input signal S1[n−1]. Hence, the voltage level over the control terminal Q[n] is selectively adjusted to a first voltage by the high voltage VGH based on the voltage level of the first input signal S1[n−1]. Explicitly, when the voltage level $V_{S1[n-1]}$ of the first input signal S1[n−1] is equal to the high voltage, an upper limit $V_{Q[n],max}$ of the voltage level over the control terminal Q[n] is expressed by the equation (2):

$$V_{Q[n],max} = \min\{V_{S1[n-1]} - VTH3, VGH\} \qquad (2)$$

In the equation (2), VTH3 is the threshold voltage of the third switch 1300. That is, the upper limit $V_{Q[n],max}$ of the voltage level over the control terminal Q[n] is determined by the lower voltage level among the voltage level of the high voltage VGH and the value of subtracting the threshold voltage VTH3 from the voltage level $V_{S1[n-1]}$ when the voltage level $V_{S1[n-1]}$ is equal to the high level.

The first terminal 1401 of the fourth switch 1400 is configured to receive the second clock signal CK2, and the second terminal 1402 of the fourth switch 1400 is electrically coupled to the control terminal 1103 of the first switch 1100. The control terminal 1403 of the fourth switch 1400 is configured to receive the third clock signal CK2B, and whether a conductive path is formed between the first terminal 1401 and the second terminal 1402 is determined based on the voltage level of the third clock signal CK2B. Specifically, because the second clock signal CK2 and the third clock signal CK2B are phase inverted in voltage, the voltage level of the third clock signal CK2B is equal to the low voltage when the voltage level of the second clock signal CK2 is equal to the high voltage. The voltage level of the third clock signal CK2B is equal to the high voltage when the voltage level of the second clock signal CK2 is equal to the low voltage. Hence, when the voltage level of the third clock signal CK2B is equal to the high voltage, the fourth switch 1400 is conducted, which means that a conductive path is formed between the first terminal 1401 and the second terminal 1402. In this condition, the voltage level over the control terminal Q[n] is pulled to the low voltage by the second clock signal CK2 because the voltage level of the second clock signal CK2 is equal to the low voltage. When the voltage level of the third clock signal CK2B is equal to the low voltage and the voltage level of the second clock signal CK2 is equal to the high voltage, the fourth switch 1400 is not conducted, which means that there is no conductive path formed between the first terminal 1401 and the second terminal 1402, if the voltage level over the control terminal Q[n] is equal to the high voltage.

Figure 2:
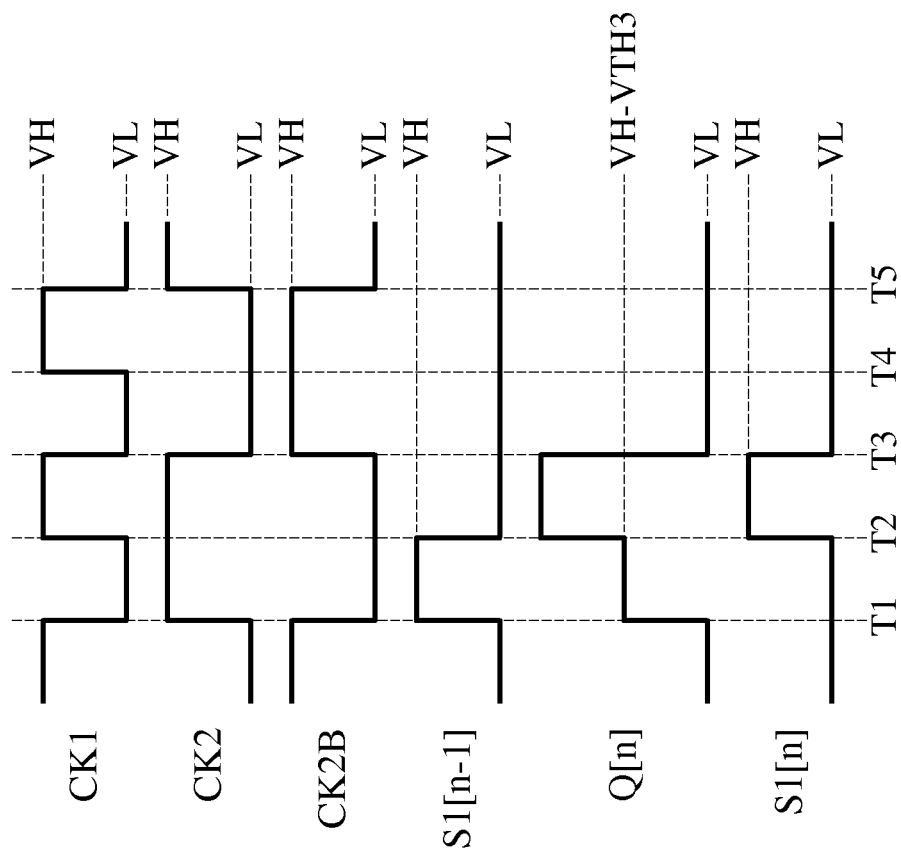
FIG. 2 illustrates the timing diagram about the signals in FIG. 1.

Please refer to FIG. 2 for explaining the timing sequence of each signal in the present embodiment. FIG. 2 illustrates the timing diagram about the signals in FIG. 1. As shown in FIG. 2, at the first time point T1, the voltage level of the first clock signal CK1 drops from the high voltage VH to the low voltage VL, and the voltage level of the second clock signal CK2 rises from the low voltage VL to the high voltage VH. At the same time, the voltage level of the third clock signal CK2B drops from the high voltage VH to the low voltage VL, and the voltage level of the first input signal S1[n−1] rises from the low voltage VL to the high voltage VH. The third switch 1300 is conducted because the voltage level of the first input signal S1[n−1] rises to the high voltage VH, and the fourth switch 1400 is not conducted because the voltage level of the third clock signal CK2B drops to the low voltage VL. Hence, the voltage level over the control terminal Q[n] is pulled to the first voltage. Assuming that the high voltage VH is equal to the high voltage VGH, the first voltage in the present embodiment is equal to the value of subtracting the threshold voltage VTH3 of the third switch 1300 from the high voltage VH. At the same time, because the voltage level of the first clock signal CK1 is equal to the low voltage VL and the second switch 1200 is not conducted because of the third clock signal CK2B and the first switch 1100 is conducted because of the voltage level over the control terminal Q[n], the voltage level of the first output signal S1[n] is clamped to be equal to the low voltage VL since the first time point T1.

Then, at the second time point T2, the voltage level of the first clock signal CK1 rises from the low voltage VL to the high voltage VH, and both of the voltage level of the second clock signal CK2 and the voltage level of the third clock signal CK2B remain unchanged, and the voltage level of the first input signal S1[n−1] drops from the high voltage VH to the low voltage VL. Since the second time point T2, because the voltage level of the first input signal S1[n−1] is equal to the low voltage VL, there is no conductive path formed between the first terminal 1301 of the third switch 1300 and the second terminal 1302 of the third switch 1300. Also, there is no conductive path formed between the first terminal 1401 of the fourth switch 1400 and the second terminal 1402 the fourth switch 1400 because the voltage level of the third clock signal CK2B remains at the low voltage VL. Hence, the voltage level over the control terminal Q [n] should remains at the value of subtracting the threshold voltage VTH3 of the third switch 1300 from the high voltage VH. However, the voltage level of the first output signal S1[n] rises from the low voltage VL because of the rising of the voltage level of the first clock signal CK1, so the variation of the voltage level of the first output signal S[n] is coupled to the control terminal Q[n] via the first capacitor C1. Accordingly, the voltage level over the control terminal Q[n] rises to be higher than the value of subtracting the threshold voltage VTH3 of the third switch 1300 from the high voltage VH. Because the voltage level over the control terminal Q[n] rises, the equivalent ON-impedance ($r_{oN}$) of the first switch 1100 is reduced, and the upper limit of the voltage level at each of the first terminal 1101 and the second terminal 1102 is increased. Eventually, the voltage level of the first output signal S1[n] can be pulled up to the high voltage VH.

At the third time point T3, the voltage level of the first clock signal CK1 and the voltage level of the second clock signal CK2 both drop from the high voltage VH to the low voltage VL. The voltage level of the third clock signal CK2B rises from the low voltage VL to the high voltage VH, so both of the second switch 1200 and the fourth switch 1400 are conducted since the third time point T3. Because the voltage level of the second clock signal CK2 is equal to the low voltage VL, the voltage level over the control terminal Q[n] is pulled to be equal to the low voltage VL making the first switch 1100 not conducted. Additionally, the voltage level of the first output signal S1 [n] is also pulled to be equal to the low voltage VL.

Then at the fourth time point T4, the voltage level of the second clock signal CK2 and the voltage level of the third clock signal CK2B both remain unchanged, so the second switch 1200 and the fourth switch 1400 both remain conducted. Because the voltage level of the first input signal S1[n−1] remains equal to the low voltage VL, the third switch 1300 is not conducted. Hence, the voltage level over the control terminal Q[n] is clamped at the low voltage VL, so the first switch 1100 is not conducted. In this condition, even if the voltage of the first clock signal CK1 rises from the low voltage VL to the high voltage VH, the voltage level of the first output signal S1[n] is kept at the low voltage VL.

In one embodiment, for preventing the voltage level of the first output signal S1[n] from being pulled high owing to the second switch 1200 being conducted between the first time point T1 and the second time point T2 because of the variation of the threshold voltage of the second switch 1200, the width over length ratio of a channel (W/L ratio) of the first switch 1100 is designed to be larger than the width over length ratio of a channel of the second switch 1200. Similarly, for preventing the voltage level over the control terminal Q[n] from being pulled high owing to the fourth switch 1400 being conducted after the fifth time point T5 because of the variation of the threshold voltage of the fourth switch 1400, the width over length ratio of a channel (W/L ratio) of the first switch 1100 is designed to be larger than the width over length ratio of a channel of the fourth switch 1400. With such design, the voltage level over the control terminal Q[n] does not vary largely even if the fourth switch 1400 is accidentally conducted because of the variation of the threshold voltage thereof.

Figure 3A:
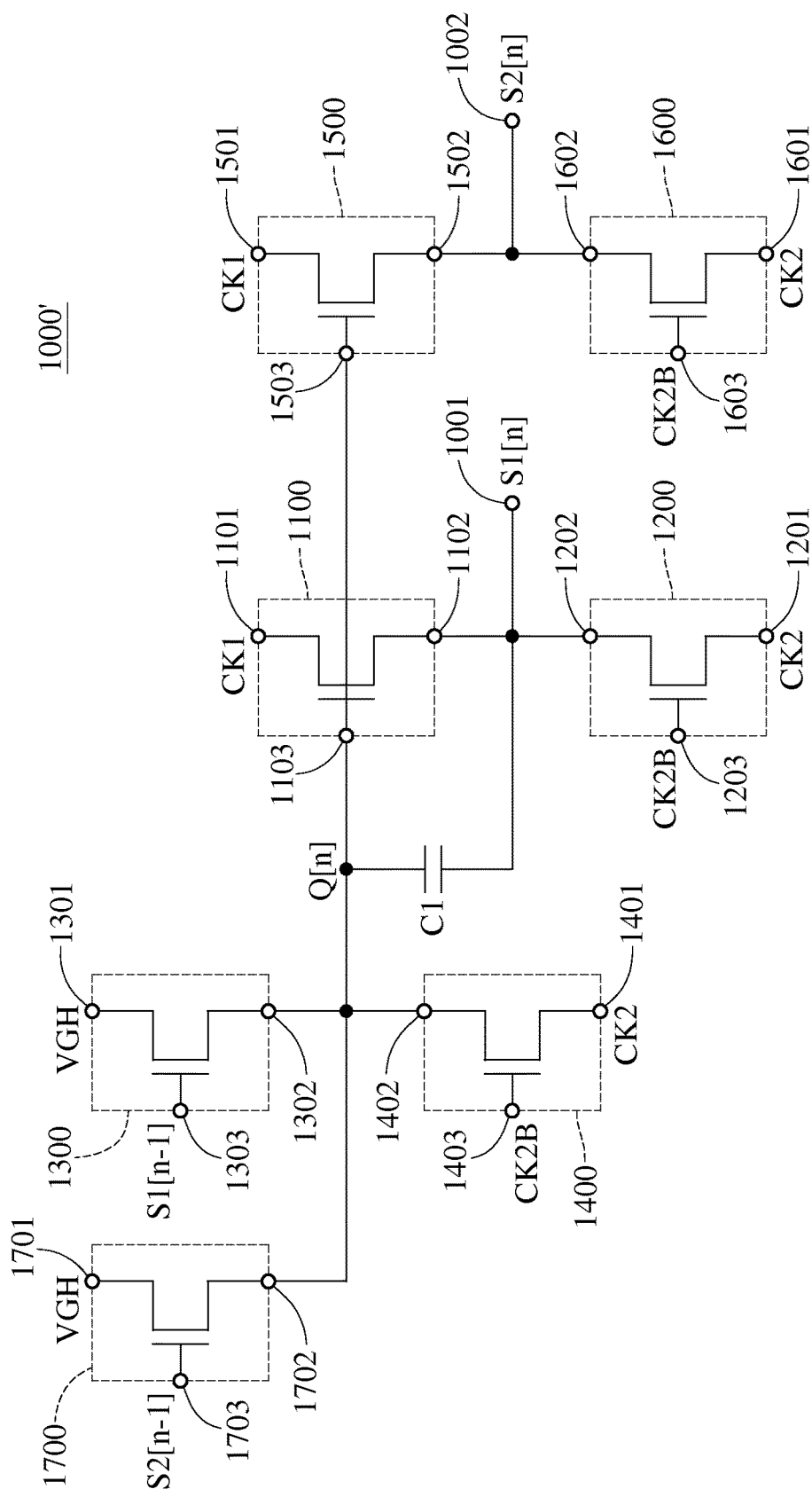
FIG. 3A is a schematic of a shift register according to another embodiment.
Figure 3B:
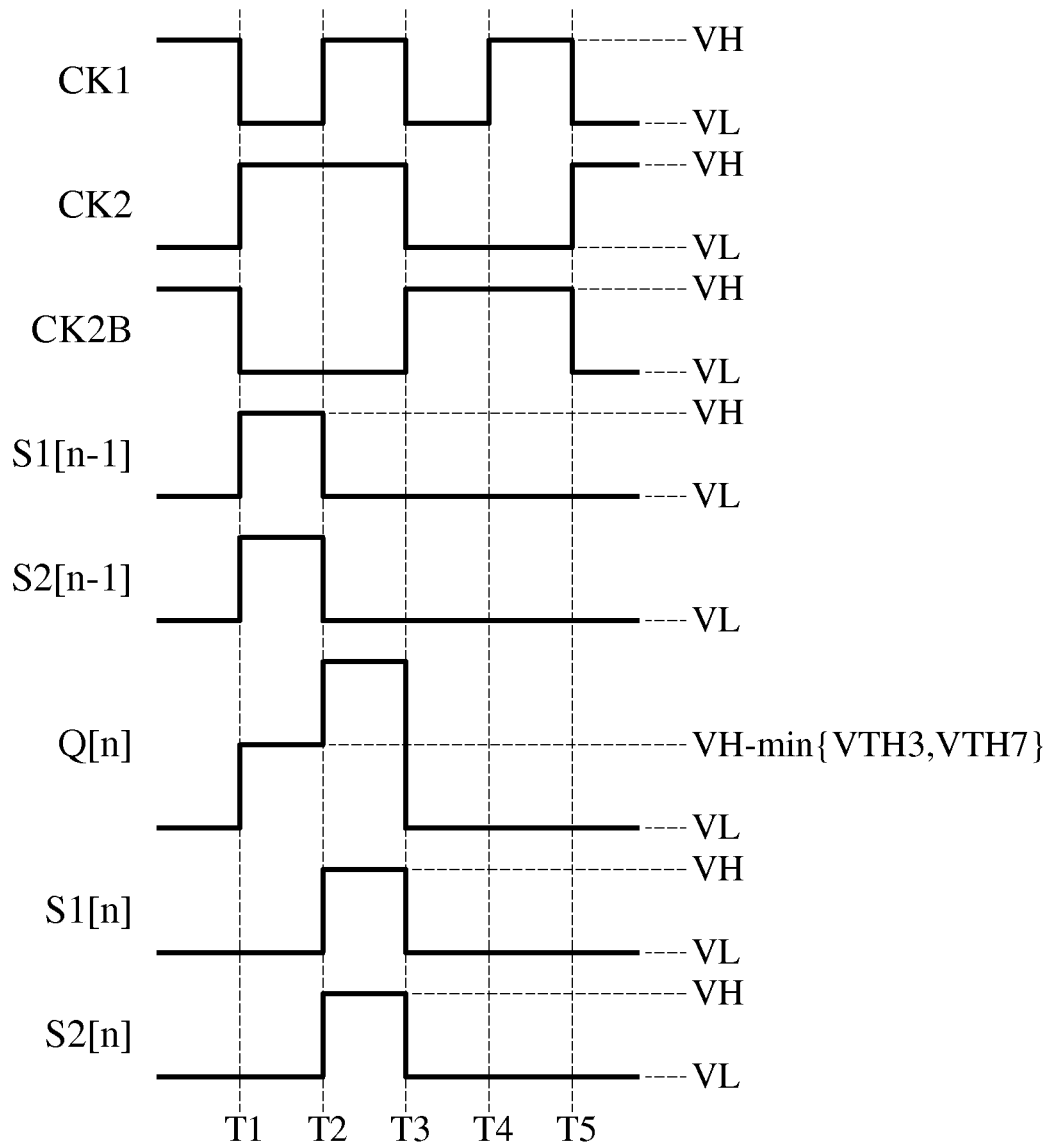
FIG. 3B illustrates the timing diagrams of the signals in FIG. 3A.

In one embodiment, please refer to FIG. 3A and FIG. 3B. FIG. 3A is a schematic of a shift register according to another embodiment, and FIG. 3B illustrates the timing diagrams of the signals in FIG. 3A. As shown in FIG. 3A, the shift register 1000', compared with the shift register 1000 in FIG. 1, further comprises the fifth switch 1500, the sixth switch 1600, the seventh switch 1700, and the second output terminal 1002. The first terminal 1501 of the fifth switch 1500 is configured to receive the first clock signal CK1, and the second terminal 1502 of the fifth switch 1500 is electrically coupled to the second output terminal 1002 of the shift register 1000'. The control terminal 1503 of the fifth switch 1500 is configured to receive the voltage level over the control terminal Q[n], and whether a conductive path is formed between the first terminal 1501 and the second terminal 1502 is determined by the voltage level over the control terminal Q[n]. Hence, the voltage level of the first clock signal CK1 is selectively outputted to the second output terminal 1002 of the shift register 1000' as the second output signal S2[n] based on the voltage level over the control terminal Q[n].

Specifically, when the voltage level over the control terminal Q[n] is equal to the low voltage, the fifth switch 1500 is not conducted, which means that there is no conductive path formed between the first terminal 1501 and the second terminal 1502. In this condition, the voltage level of the second output signal S2[n] is irrelevant to the voltage level of the first clock signal CK1.

When the voltage level over the control terminal Q[n] is equal to the high voltage, the fifth switch 1500 is conducted, which means that there is a conductive path formed between the first terminal 1501 and the second terminal 1502. In this condition, the voltage level of the second output signal S2[n] is pulled to the high voltage if the voltage level of the first clock signal CK1 is equal to the high voltage, and the voltage level of the second output signal S2[n] is pulled to the low voltage if the voltage level of the first clock signal CK1 is equal to the low voltage. However, the voltage level of the second output signal S2[n] is influenced by the threshold voltage VTHS of the fifth switch 1500 when the fifth switch 1500 is conducted.

In fact, the upper limit $V_{S2[n],max}$ of the voltage level of the second output signal S2[n] is expressed by the equation (3):

$$V_{S2[n],max} = \min\{V_{CK1}, V_{Q[n]} - VTH5\} \quad (3)$$

Briefly, the upper limit $V_{S2[n],max}$ of the voltage level of the second output signal S2[n] is determined by the lower voltage between the voltage level $V_{CK1}$ of the first clock signal CK1 and the value of subtracting the threshold voltage VTH5 of the fifth switch 1500 from the voltage level $V_{Q[n]}$ of the control terminal Q[n] when the voltage level $V_{Q[n]}$ of the control terminal Q[n] is equal to the high voltage.

The first terminal 1601 of the sixth switch 1600 is configured to receive the second clock signal CK2, and the second terminal 1602 of the sixth switch 1600 is electrically coupled to the second output terminal 1002 of the shift register 1000'. The control terminal 1603 of the sixth switch 1600 is configured to receive the third clock signal CK2B, and whether a conductive path is formed between the first terminal 1601 and the second terminal 1602 is determined based on the voltage level of the third clock signal CK2B. Because the second clock signal CK2 and the third clock signal CK2B are phase inverted in voltage, a conductive path is formed between the first terminal 1601 and the second terminal 1602 when the voltage level of the third clock signal CK2B is equal to the high voltage. In this condition, the voltage level of the second clock signal CK2 is equal to the low voltage, so the voltage level of the second output signal S2[n] outputted from the second output terminal 1002 is pulled down by the second clock signal CK2. When the voltage level of the third clock signal CK2B is equal to the low voltage, because the voltage level of the second clock signal CK2 is equal to the high voltage, the sixth switch 1600 is not conducted if the voltage level of the second output signal S2[n] is equal to the high voltage.

The first terminal 1701 of the seventh switch 1700 is configured to receive the high voltage VGH, and the second terminal 1702 of the seventh switch 1700 is electrically coupled to the control terminal 1103 of the first switch 1100 and the control terminal 1503 of the fifth switch 1500. The control terminal 1703 of the seventh switch 1700 is configured to receive the second input signal S2[n−1], and whether a conductive path is formed between the first terminal 1701 and the second terminal 1702 is determined based on the voltage level of the second input signal S2[n−1]. Hence, the voltage level over the control terminal Q[n] is selectively adjusted to a first voltage by the high voltage VGH based on the voltage level of the second input signal S2[n−1]. Explicitly, when either the voltage level $V_{S1[n-1]}$ of the first input signal S1[n−1] or the voltage level $V_{S2[n-1]}$ of the second input signal S2[n−1] is equal to the high voltage, an upper limit $V_{q[n],max}$ of the voltage level over the control terminal Q[n] is expressed by the equation (4):

$$V_{Q[n],max} = \min\{\max\{V_{S1[n-1]} - VTH3, V_{S2[n-1]} - VTH7\}, VGH\} \quad (4)$$

In the equation (4), VTH7 is the threshold voltage of the seventh switch 1700. Please refer to FIG. 3B together, if the voltage level VS1[n−1] of the first input signal S1[n−1] and the voltage level VS2[n−1] of the second input signal S2[n−1] are both equal to the high voltage VH, the upper limit VQ[n], max of the voltage level over the control terminal Q[n] is determined by the higher voltage level between the value of subtracting the threshold voltage VTH7 from the voltage level of the high voltage VGH and the value of subtracting the threshold voltage VTH3 from the high voltage VGH. With such design, there are several benefits such as: first, the upper limit VQ[n], max of the voltage level over the control terminal Q[n] is slightly raised because the threshold voltage of each switch; and second, because the third switch 1300 and the seventh switch 1700 is conducted roughly at the same time, the voltage level over the control terminal Q[n] is raised more quickly than that in the embodiment in FIG. 1.

Figure 4A:
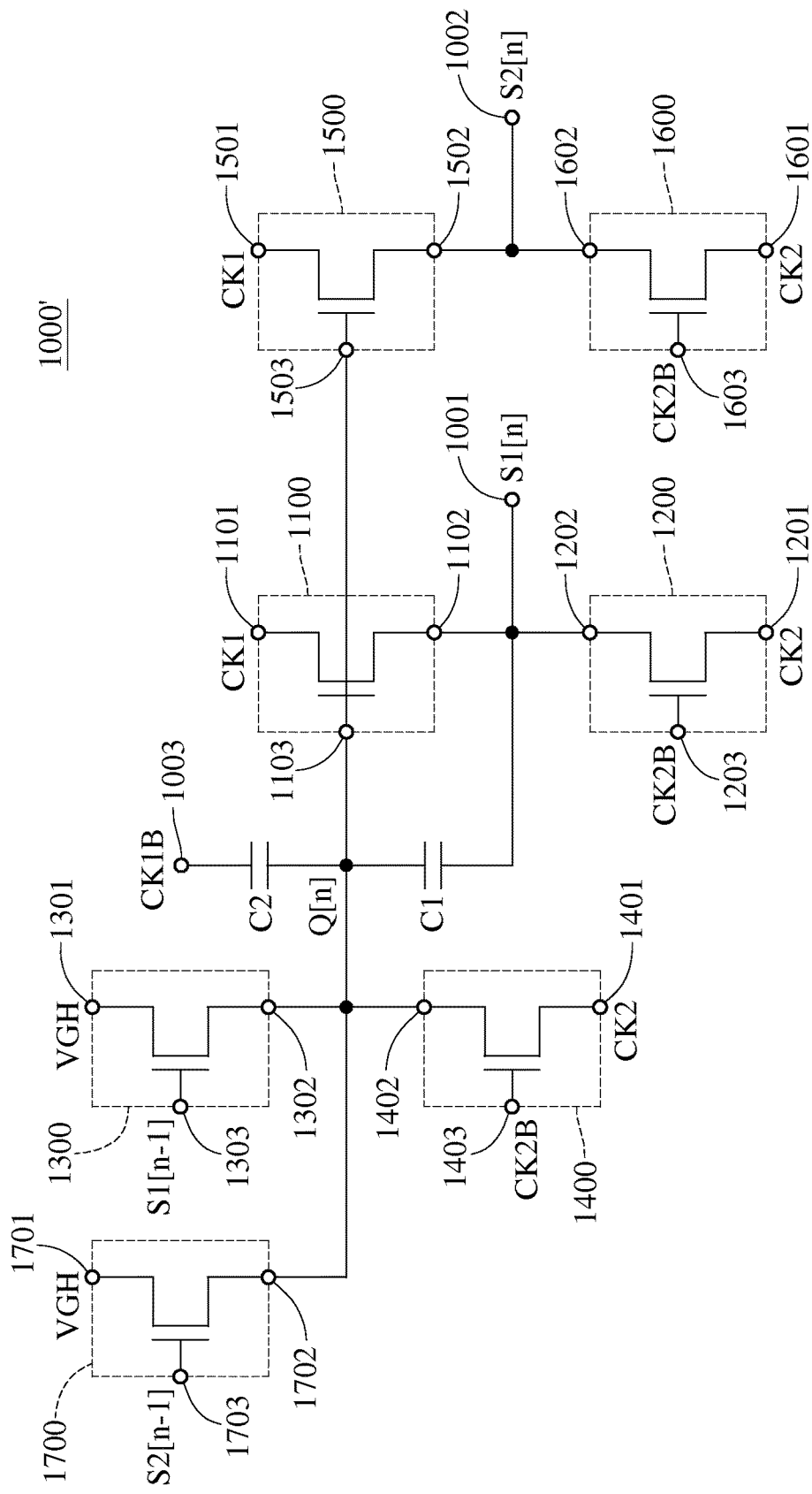
FIG. 4A is a schematic of a shift register according to another embodiment.
Figure 4B:
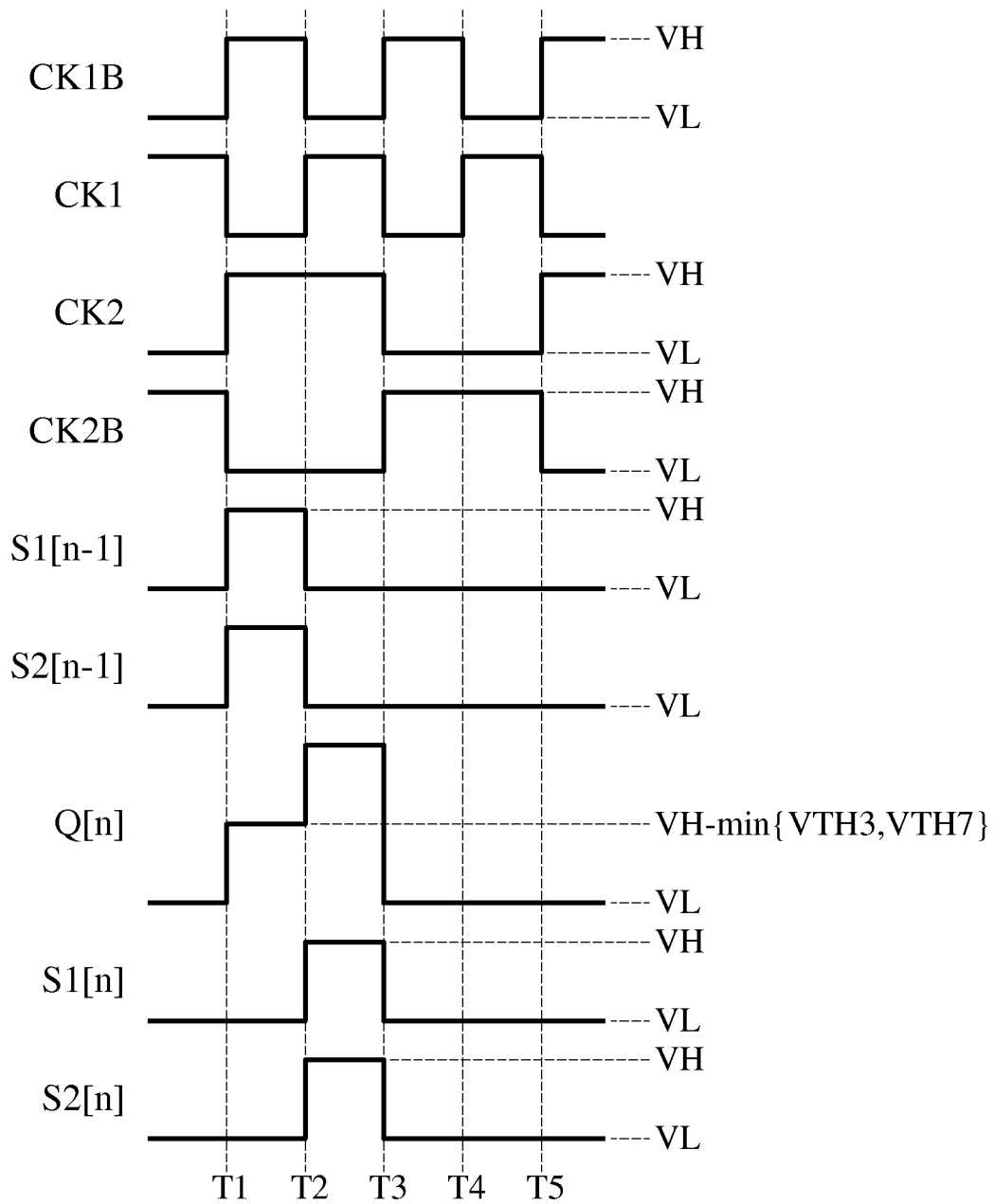
FIG. 4B illustrates the timing diagram of the signals in FIG. 4A.
Figure 5A:
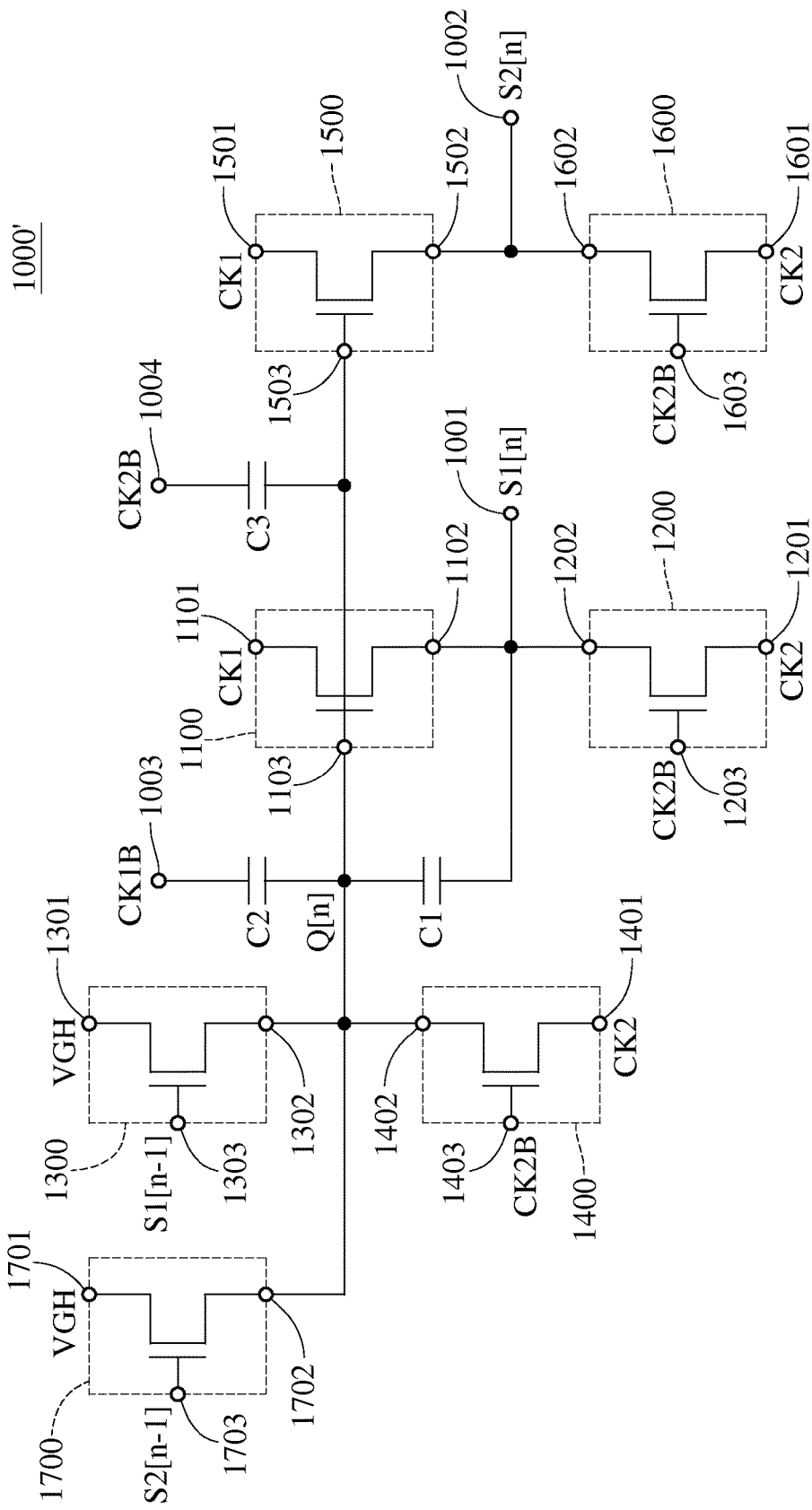
FIG. 5A is a schematic of a shift register according to yet another embodiment.
Figure 5B:
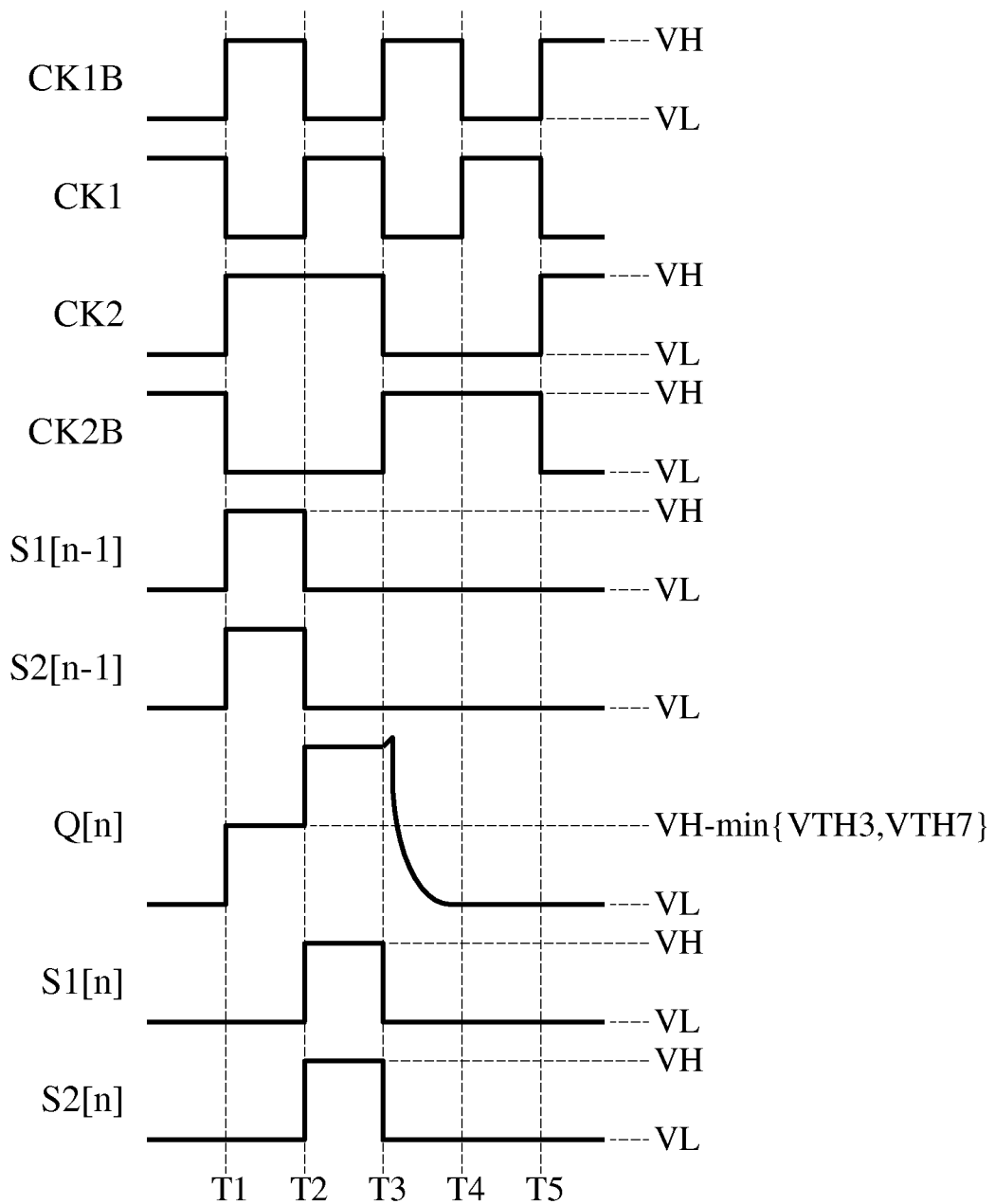
FIG. 5B illustrates the timing diagram of the signals in FIG. 5A.

In other embodiments, please refer to FIG. 4A to FIG. 5B. FIG. 4A is a schematic of a shift register according to another embodiment. FIG. 4B illustrates the timing diagram of the signals in FIG. 4A. FIG. 5A is a schematic of a shift register according to yet another embodiment. FIG. 5B illustrates the timing diagram of the signals in FIG. 5A. As shown in FIG. 4A, the shift register 1000' in one embodiment further comprises a second capacitor C2. One terminal of the second capacitor C2 is connected to a clock input terminal 1003 of the shift register 1000' and configured to receive the fourth clock signal CK1B, and the other terminal of the second capacitor C2 is connected to the control terminal 1103 of the first switch 1100. The fourth clock signal CK1B and the first clock signal CK1 are phase inverted in voltage. That is, when the voltage level of the first clock signal CK1 is equal to the high voltage, the voltage level of the fourth clock signal CK1B is equal to the low voltage, vice versa. Hence, the variation of the voltage level of the fourth clock signal CK1B is coupled to the voltage level over the control terminal Q[n] by the second capacitor C2. Please refer to FIG. 4B, at the first time point T1, the voltage level over the control terminal Q[n] is raised to the high voltage signal more quickly compared with the embodiment in FIG. 1 because the voltage level of the fourth clock signal CK1B is rising from the low voltage VL to the high voltage VH at the same time. The problem that the voltage level over the control terminal Q[n] is not pulled high efficiently because the effective ON-resistance of the third switch 1300 is too high is therefore solved.

Since the fourth time point T4, when the voltage level of the first clock signal CK1 varies, the variation is probably coupled to the control terminal Q[n] and resulting in ripples over the control terminal Q[n] because of the parasitic capacitance between the first terminal 1101 and the control terminal 1103. With the second capacitor C2 coupling the variation of the fourth clock signal CK1B phase inverted to the first clock signal CK1, the ripples over the control terminal Q[n] owing to the first clock signal CK1 is reduced or cancelled.

As shown in FIG. 5A, a shift register 1000' in one embodiment further comprises a third capacitor C3 compared with the embodiment in FIG. 4A. One terminal of the third capacitor C3 is connected to the clock input terminal 1004 of the shift register 1000' and configured to receive the third clock signal CK2B, and the other terminal of the third capacitor C3 is connected to the control terminal 1103 of the first switch 1100. The variation of the voltage level of the third clock signal CK2B is coupled to the voltage level over the control terminal Q[n] by the third capacitor C3. Please refer to FIG. 5B, at the third time point T3, the voltage level over the control terminal Q[n] is slightly raised because the voltage level of the third clock signal CK2B rises from the low voltage VL to the high voltage VH. Hence, the voltage level over the control terminal Q[n] is pulled to the low voltage later than that of the embodiment in FIG. 1 or in FIG. 3A and the first switch 1100 and/or the fifth switch 1500 is then turned off later in this embodiment than in the embodiment in FIG. 1. Because the voltage level of the first clock signal CK1 is dropping from the high voltage VH to the low voltage VL at the third time point T3, the voltage level of the first output signal S1[n] and the voltage level of the second output signal S2[n] is pulled down to the low voltage VL more quickly in this embodiment than in the embodiment shown in FIG. 1 if the first switch 1100 is turned off later.

Additionally, the third capacitor C3 together with the third clock signal CK2B is capable of cancelling the ripples over the voltage level over the control terminal Q[n] owing to the first clock signal CK1 with the same manner of the second capacitor C2 together with the fourth clock signal CK1B.

Figure 6A:
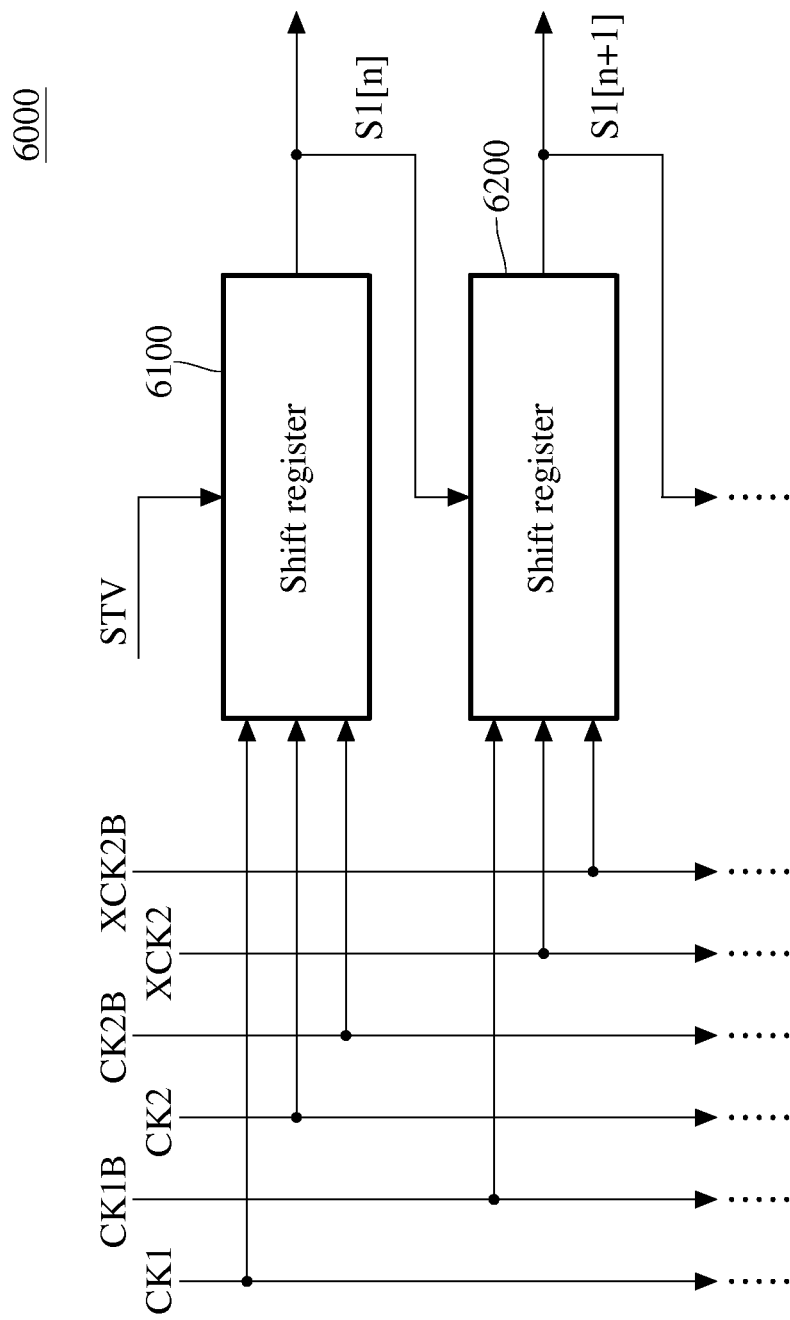
FIG. 6A is a schematic of a shifting control circuit in one embodiment.
Figure 6B:
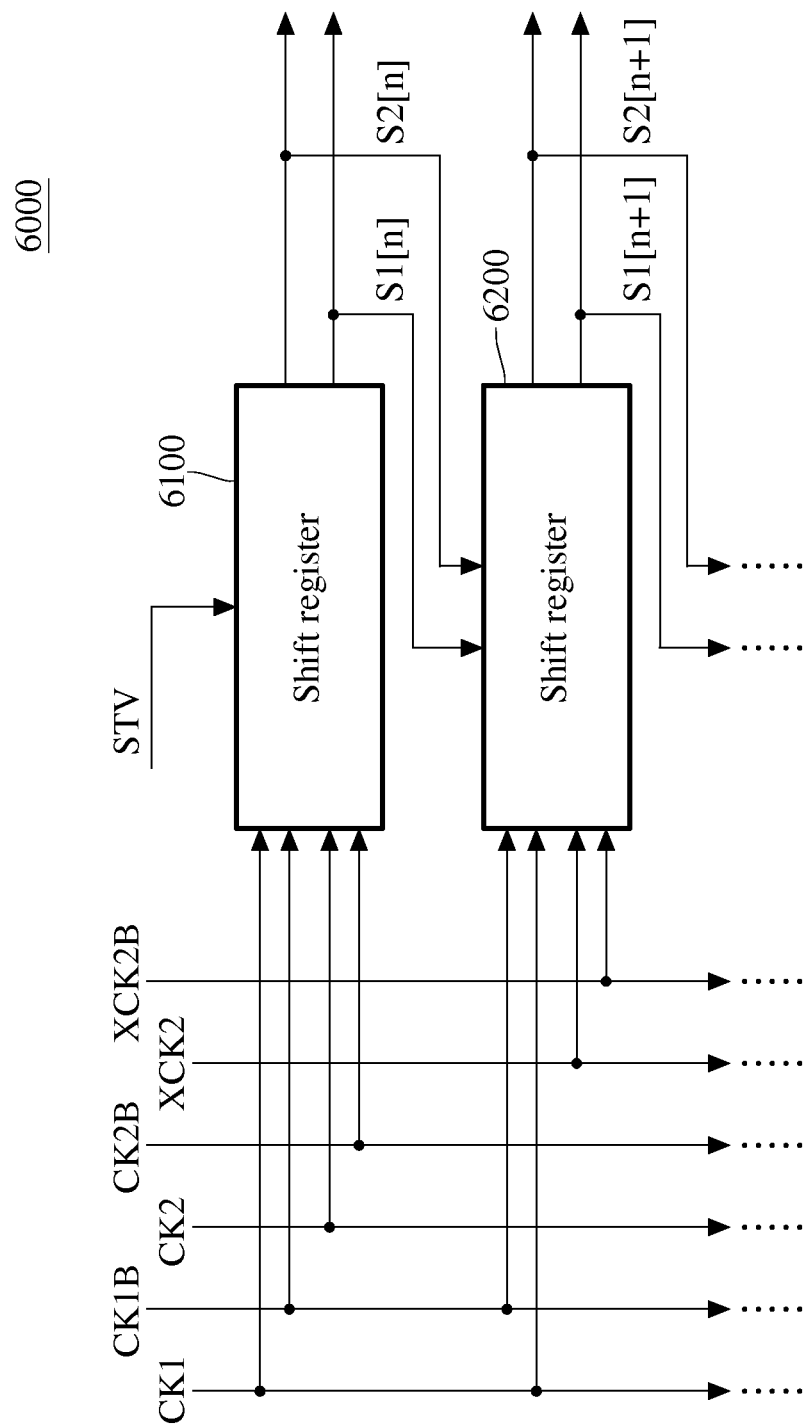
FIG. 6B is a schematic of a shifting control circuit in another embodiment.
Figure 7:
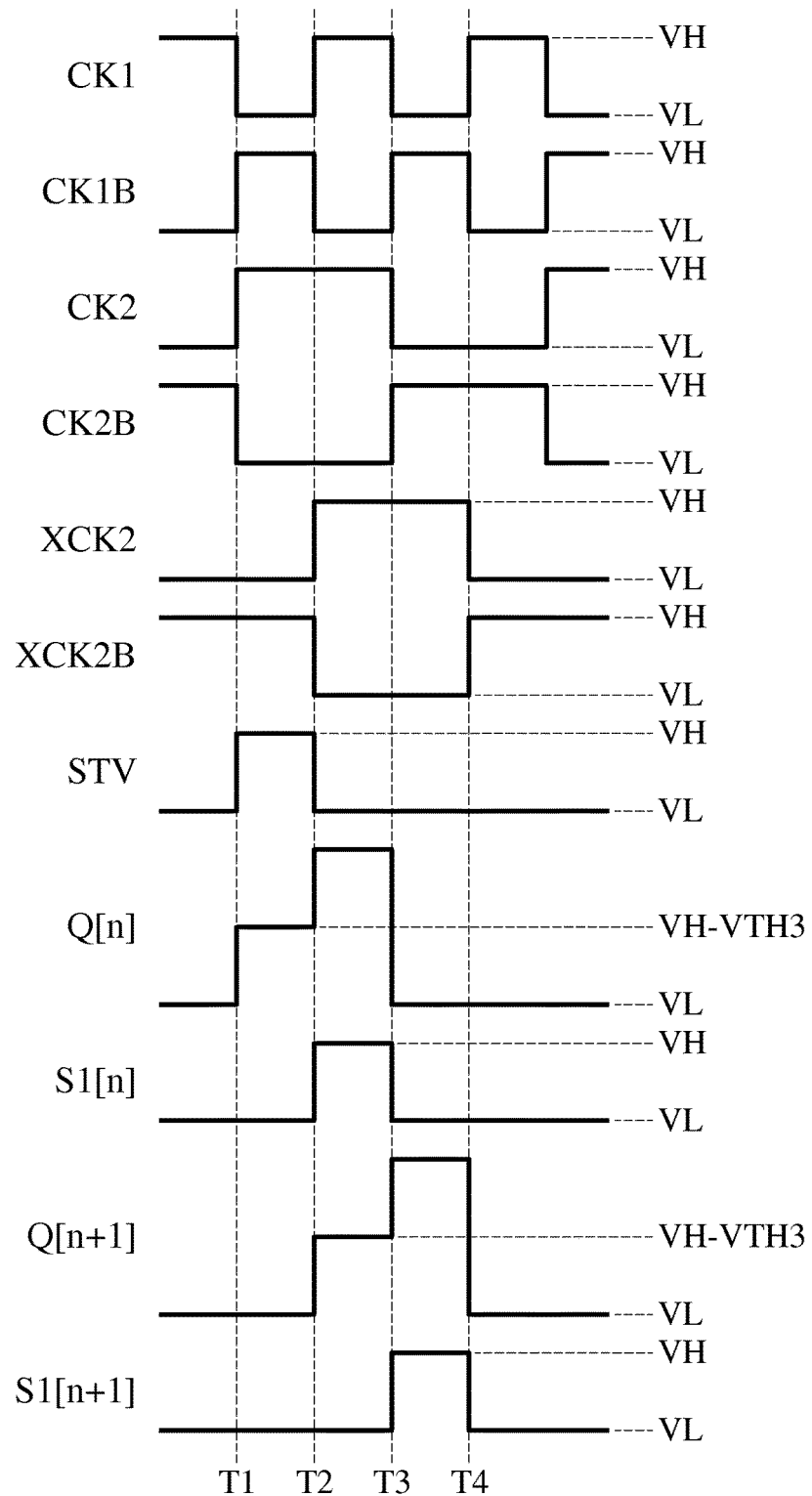
FIG. 7 illustrates the timing diagram of the signals in FIG. 6B.

In yet another embodiment, please refer to FIG. 6A, FIG. 6B, and FIG. 7 for how the shift register in the aforementioned embodiment(s) is utilized in integrated circuits and the connection architecture thereof. FIG. 6A is a schematic of a shifting control circuit in one embodiment. FIG. 6B is a schematic of a shifting control circuit in another embodiment. FIG. 7 illustrates the timing diagram of the signals in FIG. 6B. As shown in FIG. 6A and FIG. 6B, the shifting control circuit 6000 comprises the shift register 6100 and the shift register 6200. The architecture of the shift registers in FIG. 6A is as the shift register 1000 shown in FIG. 1. The architecture of the shift registers in FIG. 6B is as the shift register 1000' shown in FIG. 4A. In FIG. 6A, the first output signal S1[n] of the shift register 6100 and the first output signal S1[n+1] of the shift register 6200 is used as the timing control signals in display device or other electronic device in addition to as the first input signal of the next shift register. For example, the first output signal S1[n] is used as the first input signal of the shift register 6200. In FIG. 6A, similarly, the first output signal S1[n] of the shift register 6100 and the first output signal S1[n+1] of the shift register 6200 is used as the timing control signals in display device or other electronic device in addition to as the first input signal of the next shift register. For example, the first output signal S1[n] is used as the first input signal of the shift register 6200.

Take FIG. 6B for example, the first clock signal CK1, the second clock signal CK2, the third clock signal CK2B, and the fourth clock signal CK1B are took as the first clock of the shift register 6100, the second clock signal of the shift register 6100, the third clock signal of the shift register 6100, and the fourth clock signal of the shift register 6100, respectively. The shift register 6100 takes the starting signal STV as its first input signal and second input signal so as to generate its first output signal S1[n] and its second output signal S2[n]. The fourth clock signal CK1B, the first clock signal CK1, the fifth clock signal XCK2, and the sixth clock signal XCK2B are took as the first clock of the shift register 6200, the fourth clock signal of the shift register 6200, the second clock signal of the shift register 6200, and the third clock signal of the shift register 6200, respectively. The shift register 6200 takes the first output signal S1[n] and the second output signal S2[n] as its first input signal and second input signal so as to generate the first output signal S1[n+1] and the second output signal S2[n+1]. It can be observed that the fifth clock signal XCK2 falls behind the second clock signal CK2 with a quarter period, and the sixth clock signal XCK2B is phase inverted in voltage compared with the fifth clock signal XCK2.

In other words, if a plurality of shift register are connected in series to be a multi-level shifting control circuit, the $(2k-1)^{th}$ shift registers all have the same arrangement of clock signals, and the $(2k)^{th}$ shift registers all have the same arrangement of clock signals, wherein k is a positive integer. However, the arrangement of clock signals of the $(2k-1)^{th}$ shift registers is different from that of the $(2k)^{th}$ shift registers. Explicitly, take FIG. 6B and FIG. 7 for example, if the $(2k-1)^{th}$ shift registers take the first clock signal CK1, the second clock signal CK2, the third clock signal CK2B, and the fourth clock signal CK1B as their first clock signal, second clock signal, third clock signal, and fourth clock signal, respectively, the $(2k)^{th}$ shift registers would take the fourth clock signal CK1B, the fifth clock signal XCK2, the sixth clock signal XCK2B, and the first clock signal CK1 as their first clock signal, second clock signal, third clock signal, and fourth clock signal, respectively.

As shown in FIG. 7, at the first time point T1, the voltage level of the first clock signal CK1 and the voltage level of the third clock signal CK2B both drop from the high voltage VH to the low voltage VL, and the voltage level of the second clock signal CK2, the voltage level of the fourth clock signal CK1B, and the voltage level of the starting signal STV all rises from the low voltage VL to the high voltage VH. Hence, the voltage level over the control terminal Q[n] of the shift register 6100 rises. Then, at the second time point T2, the voltage level of the first clock signal CK1 and the voltage level of the fifth clock signal XCK2 both rise from the low voltage VL to the high voltage VH, and the voltage level of the fourth clock signal CK1B, the voltage level of the starting signal STV, the voltage level of the sixth clock signal XCK2B all drop from the high voltage VH to the low voltage VL. Hence, since the second time point T2, the voltage level of the first output signal S1[n] and the voltage level of the second output signal S2[n] both rise to the high voltage VH so that voltage level over the control terminal Q[n] rises again. The voltage level over the control terminal Q[n+1] of the shift register 6200 is also pulled high. At the third time point T3, the voltage level of the first clock signal CK1 and the voltage level of the second clock signal CK2 both drop from the high voltage VH to the low voltage VL, and the voltage level of the third clock signal CK2B and the voltage level of the fourth clock signal CK1B both rise from the low voltage VL to the high voltage VH. Hence, the voltage level over the control terminal Q[n] of the shift register 6100 is pulled to the low voltage VL, so as the voltage level of the first output signal S1[n] and the voltage level of the second output signal S2[n]. The voltage level of the first output signal S1[n+1] and the voltage level of the second output signal S2[n+1] are both pulled high so that the voltage level over the control terminal Q[n+1] of the shift register 6200 rises again. At time point T4, the voltage level of the first clock signal CK1 and the voltage level of the sixth clock signal XCK2B both rise from the low voltage VL to the high voltage VH, and the voltage level of the fourth clock signal CK1B and the voltage level of the fifth clock signal XCK2 both drop from the high voltage VH to the low voltage VL. Hence, the voltage level over the control terminal Q[n+1] of the shift register 6200, the first output signal S1[n+1] of the shift register 6200, and the second output signal S2[n+1] of the shift register 6200 are all pulled down to the low voltage VL.

What is claimed is:

1. A shift register, comprising:
   a first switch electrically coupled to a control terminal and configured to selectively conduct a first clock signal to a first output terminal as a first output signal based on a voltage level over the control terminal;
   a second switch electrically coupled to the first switch and configured to receive a second clock signal different from the first clock signal and a third clock signal phase inverted to the second clock signal and to selectively force a voltage level of the first output signal equal to a voltage level of the second clock signal based on the second clock signal and the third clock signal;
   a third switch electrically coupled to the first switch and configured to selectively force a voltage level over the control terminal essentially equal to a first voltage based on a first input signal; and
   a fourth switch electrically coupled to the first switch and configured to receive the second clock signal and the third clock signal and to selectively force the voltage level over the control terminal equal to the voltage level of the second clock signal based on the second clock signal and the third clock signal.

2. The shift register in claim 1, further comprising:
a fifth switch configured to selectively conduct the first clock signal to a second output terminal as a second output signal based on the voltage level over the control terminal; and
a sixth switch electrically coupled to the first switch configured to receive the second clock signal and the third clock signal and to selectively force a voltage level of the second output signal equal to the voltage level of the second clock signal based on the second clock signal and the third clock signal.

3. The shift register in claim 2, further comprising:
a seventh switch electrically coupled to the first switch and configured to selectively force the voltage level over the control terminal essentially equal to the first voltage based on a second input signal.

4. The shift register in claim 2, wherein a W/L ratio of the first switch is larger than a W/L ratio of the second switch.

5. The shift register in claim 2, wherein a W/L ratio of the first switch is larger than a W/L ratio of the fourth switch.

6. The shift register in claim 1, wherein the second switch comprises:
a first terminal configured to receive the second clock signal;
a second terminal electrically coupled to the first output terminal; and
a third terminal configured to receive the third clock signal;
wherein a electrical path between the first terminal of the second switch and the second terminal of the second switch is selectively conducted based on the third clock signal.

7. The shift register in claim 6, wherein a W/L ratio of the first switch is larger than a W/L ratio of the second switch.

8. The shift register in claim 6, wherein a W/L ratio of the first switch is larger than a W/L ratio of the fourth switch.

9. The shift register in claim 1, wherein the fourth switch comprises:
a first terminal configured to receive the second clock signal;
a second terminal electrically coupled to the control terminal; and
a third terminal configured to receive the third clock signal;
wherein a electrical path between the first terminal of the fourth switch and the second terminal of the fourth switch is selectively conducted based on the third clock signal.

10. The shift register in claim 9, wherein a W/L ratio of the first switch is larger than a W/L ratio of the second switch.

11. The shift register in claim 9, wherein a W/L ratio of the first switch is larger than a W/L ratio of the fourth switch.

12. The shift register in claim 1, further comprising a first capacitor electrically coupled between the first output terminal and the control terminal and configured to couple a voltage variation of the first output signal to the voltage level over the control terminal.

13. The shift register in claim 12, wherein a W/L ratio of the first switch is larger than a W/L ratio of the second switch.

14. The shift register in claim 12, wherein a W/L ratio of the first switch is larger than a W/L ratio of the fourth switch.

15. The shift register in claim 1, further comprising a second capacitor electrically coupled to the control terminal and configured to receive a fourth clock signal and to couple a voltage variation of the fourth clock signal to the voltage level over the control terminal, wherein the fourth clock signal is phase inverted to the first clock signal.

16. The shift register in claim 1, further comprising a third capacitor electrically coupled to the control terminal and configured to receive the third clock signal and to couple a voltage variation of the third clock signal to the voltage level over the control terminal.

17. The shift register in claim 1, wherein a W/L ratio of the first switch is larger than a W/L ratio of the second switch.

18. The shift register in claim 1, wherein a W/L ratio of the first switch is larger than a W/L ratio of the fourth switch.

19. The shift register in claim 1, wherein the second clock signal is a signal frequency divided from the first clock signal.

20. The shift register in claim 1, wherein a frequency of the second clock signal is half of a frequency of the first clock signal.

* * * * *